United States Patent
Tan et al.

(10) Patent No.: US 10,663,231 B2
(45) Date of Patent: May 26, 2020

(54) MANUFACTURING METHOD OF HEAT CONDUCTING DEVICE

(71) Applicant: DELTA ELECTRONICS, INC., Taoyuan (TW)

(72) Inventors: Li-Kuang Tan, Taoyuan (TW); Shih-Kang Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 347 days.

(21) Appl. No.: 15/615,140

(22) Filed: Jun. 6, 2017

(65) Prior Publication Data
US 2017/0356694 A1   Dec. 14, 2017

Related U.S. Application Data

(60) Provisional application No. 62/347,459, filed on Jun. 8, 2016.

(30) Foreign Application Priority Data

May 25, 2017   (CN) .......................... 2017 1 0377130

(51) Int. Cl.
*F28D 15/02*   (2006.01)
*F28D 15/04*   (2006.01)
(Continued)

(52) U.S. Cl.
CPC .......... *F28D 15/0275* (2013.01); *B23P 15/26* (2013.01); *F28D 15/0233* (2013.01);
(Continued)

(58) Field of Classification Search
CPC ......... Y10T 29/49353; Y10T 29/49359; B23P 15/26; B23P 2700/09; B23P 2700/10; F28D 15/0275; F28D 15/046; F28D 15/0266
See application file for complete search history.

(56) References Cited

U.S. PATENT DOCUMENTS 5,216,580 A * 6/1993 Davidson ............ F28D 15/0266
361/700
5,253,702 A * 10/1993 Davidson ............ F28D 15/0233
165/80.4
(Continued)

FOREIGN PATENT DOCUMENTS

CN   205093079 U   3/2016

*Primary Examiner* — Jason L Vaughan
(74) *Attorney, Agent, or Firm* — Muncy, Geissler, Olds & Lowe, P.C.

(57) ABSTRACT

A manufacturing method of a heat conducting device includes following steps: providing a first plate, which includes a plate body and at least a heat conducting element, wherein the plate body has at least an inserting end disposed corresponding to the heat conducting element and defining a tube, and the heat conducting element is mounted at the tube; providing a second plate, which has a first opening end; disposing a first wick structure on an internal wall of the heat conducting element and a bottom surface of the plate body; disposing a second wick structure on an internal wall of the second plate; and connecting the plate body to the first opening end so as to connect the first plate and the second plate to form a chamber. Accordingly, the heat conducting device has a higher heat conducting efficiency.

14 Claims, 8 Drawing Sheets

(51) Int. Cl.
   *H01L 23/373*  (2006.01)
   *H01L 21/48*   (2006.01)
   *H01L 23/427*  (2006.01)
   *B23P 15/26*   (2006.01)
   *H01L 23/367*  (2006.01)

(52) U.S. Cl.
   CPC ....... *F28D 15/0266* (2013.01); *F28D 15/046* (2013.01); *H01L 21/4882* (2013.01); *H01L 23/3736* (2013.01); *H01L 23/427* (2013.01); *H01L 23/3672* (2013.01); *Y10T 29/49353* (2015.01); *Y10T 29/49359* (2015.01)

(56) References Cited

U.S. PATENT DOCUMENTS

| | | | | |
|---|---|---|---|---|
| 5,720,338 | A * | 2/1998 | Larson | F28D 15/0241 165/104.26 |
| 6,237,223 | B1 * | 5/2001 | McCullough | B23P 15/26 257/E23.089 |
| 6,490,160 | B2 * | 12/2002 | Dibene, II | G06F 1/18 165/104.26 |
| 6,843,307 | B2 * | 1/2005 | Yuyama | F28D 15/0233 165/104.21 |
| 9,436,235 | B2 * | 9/2016 | Damaraju | G06F 1/20 |
| 10,119,766 | B2 * | 11/2018 | Lin | F28D 15/0266 |
| 2005/0167086 | A1 * | 8/2005 | Rosenfeld | B22F 3/1103 165/104.26 |
| 2005/0189091 | A1 * | 9/2005 | Rosenfeld | B22F 3/1103 165/104.26 |
| 2005/0205243 | A1 * | 9/2005 | Rosenfeld | B22F 3/1103 165/104.26 |
| 2005/0236143 | A1 * | 10/2005 | Garner | F28D 15/0233 165/104.26 |
| 2006/0143916 | A1 * | 7/2006 | Tsai | F28D 15/0233 29/890.032 |
| 2007/0272399 | A1 * | 11/2007 | Nitta | F28D 15/0233 165/185 |
| 2009/0040726 | A1 * | 2/2009 | Hoffman | B22F 3/20 361/700 |
| 2009/0260785 | A1 * | 10/2009 | Wang | B22F 5/003 165/170 |
| 2010/0071879 | A1 * | 3/2010 | Hou | F28D 15/0233 165/104.26 |
| 2010/0077614 | A1 * | 4/2010 | Hou | B22F 7/004 29/890.032 |
| 2010/0108297 | A1 * | 5/2010 | Chen | F28D 15/0233 165/104.26 |
| 2011/0008198 | A1 * | 1/2011 | Hou | B22F 1/0011 419/6 |
| 2012/0175086 | A1 * | 7/2012 | Rosenfeld | B22F 3/1103 165/104.26 |
| 2017/0312871 | A1 * | 11/2017 | Lin | B23P 15/26 |
| 2017/0314873 | A1 * | 11/2017 | Lin | F28D 15/046 |

* cited by examiner

MANUFACTURING METHOD OF HEAT CONDUCTING DEVICE

CROSS REFERENCE TO RELATED APPLICATIONS

The non-provisional patent application claims priority to U.S. provisional patent application with Ser. No. 62/347,459 filed on Jun. 8, 2016. This and all other extrinsic materials discussed herein are incorporated by reference in their entirety.

This Non-provisional application claims priority under 35 U.S.C. § 119(a) on Patent Application No(s). 201710377130.0 filed in People's Republic of China on May 25, 2017, the entire contents of which are hereby incorporated by reference.

BACKGROUND OF THE DISCLOSURE

Field of Disclosure

The present disclosure relates to a manufacturing method of a heat conducting device.

Related Art

Heat pipes and temperature plates (or vapor chambers) are commonly used high performance heat conducting device having the features of high heat conducting efficiency, less weight, simple structure and free from electricity. Accordingly, the heat conducting device containing the heat pipes and vapor chambers have been widely applied to various high-performance commercial heat-dissipating devices, such as dissipate heat of servers, communication apparatuses, VGA, or high-performance LED.

In the conventional manufacturing method of the heat conducting device, the wick structure is disposed on the inner wall of the heat pipe and vapor chamber, and then the heat pipe is inserted into the opening of the vapor chamber. Then, the heat pipe is welded to the top surface of the vapor chamber. However, the wick structure is discontinuous at the welding portion of the heat pipe and the vapor chamber, so that the internal vapor space is not continuous. This structure will have additional thermal resistance at the connecting portions of the solder, vapor chamber and heat pipe, which can reduce the heat conducting efficiency.

SUMMARY OF THE DISCLOSURE

An objective of the disclosure is to provide a manufacturing method of a heat conducting device that can achieve a higher heat conducting efficiency.

A manufacturing method of a heat conducting device of the disclosure includes following steps: providing a first plate, which includes a plate body and at least a heat conducting element, wherein the plate body has at least an inserting end disposed corresponding to the heat conducting element and defining a tube, and the heat conducting element is mounted at the tube; providing a second plate, which has a first opening end; disposing a first wick structure on an internal wall of the heat conducting element and a bottom surface of the plate body; disposing a second wick structure on an internal wall of the second plate; and connecting the plate body to the first opening end so as to connect the first plate and the second plate to form a chamber.

In one embodiment, the heat conducting element is a heat pipe or a temperature plate. The first plate can be integrally formed as one piece. A size of an inner side of the first opening end is substantially the same as a size of the plate body. The heat conducting element is connected to the plate body by sintering or welding. The first plate and the second plate are connected by sintering or welding.

In one embodiment, the heat conducting element has a second opening end, and the manufacturing method further includes a step of: inserting the second opening end of the heat conducting element into an inner side of the tube.

In one embodiment, the heat conducting element has a second opening end, and the manufacturing method further includes a step of: inserting the second opening end of the heat conducting element on an outer side of the tube.

In one embodiment, the manufacturing method further includes steps of: providing a mold, wherein a shape of the mold corresponds to a shape of the first plate; disposing the first wick structure on a surface of the mold; inserting the mold with the first wick structure to the heat conducting element of the first plate; disposing the first wick structure on the internal wall of the heat conducting element and the bottom surface of the plate body through the mold; and removing the mold.

In one embodiment, the thicknesses of the plate body and the first wick structure are substantially the same as a distance between the first opening end and the second wick structure. Accordingly, when the plate body of the first plate is connected to the first opening end of the second plate, the first wick structure and the second wick structure are connected to form a continuous wick structure.

In one embodiment, before the step of connecting the first plate and the second plate to form the chamber, the manufacturing method further includes steps of: providing at least a supporting member; and disposing the supporting member between the second wick structure of the second plate and the first wick structure of the plate body for preventing the subsidence of the first plate. The supporting member has a structure the same as the first wick structure or the second wick structure.

In one embodiment, the manufacturing method further includes steps of: providing a plurality of fins; and assembling the fins to the heat conducting element.

In one embodiment, the manufacturing method further includes steps of: vacuuming the chamber; and filling a working fluid into the chamber.

As mentioned above, the manufacturing method of the disclosure can form a continuous wick structure on the inner wall between the heat conducting element and the vapor chamber without undesired thermal resistance. Accordingly, the gaseous state working fluid can be rapidly transferred from the vapor chamber to each of the heat conducting elements without the obstruction of additional thermal resistance. Besides, the liquid state working fluid, which is condensed from the gaseous state working fluid by the heat conducting element, can flow back to the vapor chamber through the wick structure without undesired obstruction. Therefore, the heat conducting device fabricated by the manufacturing method of the disclosure can have higher heat conducting efficiency.

BRIEF DESCRIPTION OF THE DRAWINGS

The present disclosure will become more fully understood from the subsequent detailed description and accompanying drawings, which are given by way of illustration only, and thus are not limitative of the present disclosure, and wherein.

DETAILED DESCRIPTION OF THE DISCLOSURE

The present disclosure will be apparent from the following detailed description, which proceeds with reference to the accompanying drawings, wherein the same references relate to the same elements.

Figure 1:
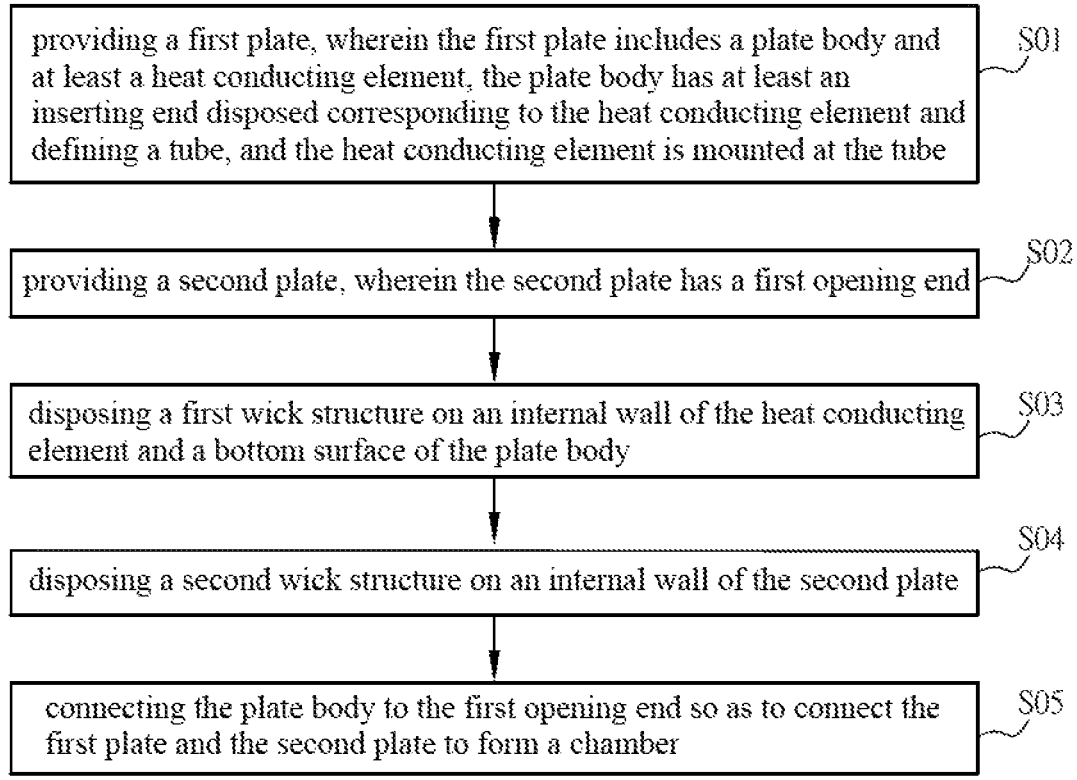
FIG. 1 is a schematic flow chart of a manufacturing method of a heat conducting device according to an embodiment of the disclosure.

FIG. 1 is a schematic flow chart of a manufacturing method of a heat conducting device according to an embodiment of the disclosure.

Referring to FIG. 1, the manufacturing method of a heat conducting device of the disclosure includes following steps: providing a first plate, which includes a plate body and at least a heat conducting element, wherein the plate body has at least an inserting end disposed corresponding to the heat conducting element and defining a tube, and the heat conducting element is mounted at the tube (step S01); providing a second plate, which has a first opening end (step S02); disposing a first wick structure on an internal wall of the heat conducting element and a bottom surface of the plate body (step S03); disposing a second wick structure on an internal wall of the second plate (step S04); and connecting the plate body to the first opening end so as to connect the first plate and the second plate to form a chamber (step S05).

FIGS. 2A to 2I are schematic diagrams showing the manufacturing procedures of the heat conducting device 1 according to an embodiment of the disclosure, respectively. The steps S01~S05 will be described in detail with reference to FIG. 1 in view of FIGS. 2A to 2I.

Figure 2A:
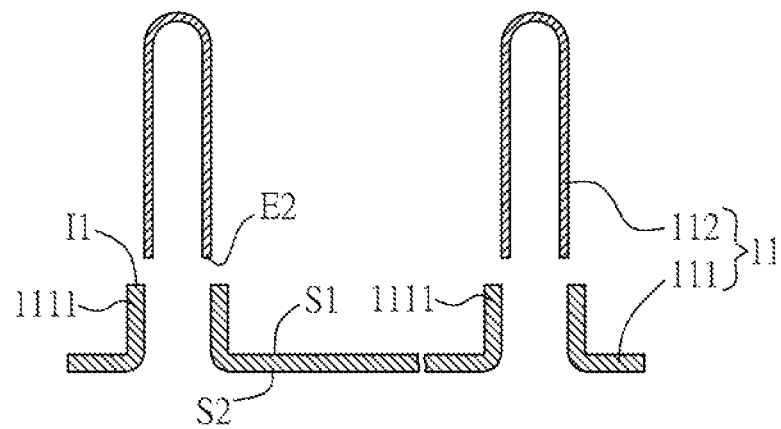
FIGS. 2A to 2I are schematic diagrams showing the manufacturing procedures of the heat conducting device according to an embodiment of the disclosure, respectively.
Figure 2B:
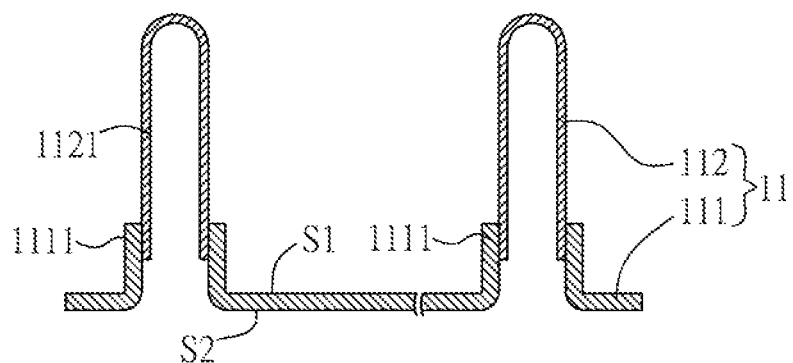

As shown in FIGS. 2A and 2B, the step S01 is to provide a first plate 11. The first plate 11 includes a plate body 111 and at least one heat conducting element 112, and the plate body has a top surface S1 and a bottom surface S2, which are disposed opposite to each other. The plate body 111 has at least one inserting end I1 corresponding to the amount, shape and position or location of the heat conducting element 112. The inserting end I1 is disposed in a ring area around the plate body 111 and extends upwardly from the top surface S1. Each inserting end I1 can define a tubular structure (tube 1111) on the plate body 111, and the heat conducting element 112 is correspondingly mounted at the tube 1111. In addition, the heat conducting element 112 is connected to one side closing to the top surface S1, and the plate body 111 is a closed state as viewing from the bottom surface S2.

The material of the plate body 111 or the heat conducting element 112 can be metal (e.g. copper or aluminum) or alloy having high heat transfer coefficient. In this embodiment, the plate body 111 and the heat conducting element 112 are made of copper, and the first plate 11 has two heat conducting elements 112 connecting to the top surface S1 of the plate body 111. Herein, the heat conducting element 112 can be a heat pipe or a temperature plate (or vapor chamber), and the disclosure is not limited.

The first plate 11 can be integrally formed as one piece or be formed by assembling two or more parts. In this embodiment, the first plate 11 is formed by assembling two parts. As mentioned above, the plate body 111 has the inserting ends I1 corresponding to the number, shape and positions or locations of the heat conducting elements 112, and each heat conducting element 112 has an opening end E2 (herein, the second opening end E2) corresponding to the inserting end I1. In the step S01, the second opening end E2 of the heat conducting elements 112 is mounted on the tube 1111, which is defined by the inserting end I1 of the plate body 111, and then the heat conducting elements 112 is connected to the tube 1111 for assembling the first plate 11.

To be noted, FIG. 2B shows an example that the second opening end E2 is connected to the inner side of the tube 1111. Of course, in other embodiments, the second opening end E2 can be connected to the outer side of the tube 1111 of the inserting end I2, the first opening end E2 of the heat conducting elements 112 can also be mounted into the tube 1111, however, it depends on design and relative tube radius of the second opening end E2 and the tube 1111. In this case, the heat conducting elements 112 can be connected to the inserting end I1 of the plate body 111 by welding or sintering (e.g. the open fire sintering, laser sintering, infrared sintering, or the sintering by other heating methods). This disclosure is not limited.

Figure 2C:
Figure 2D:
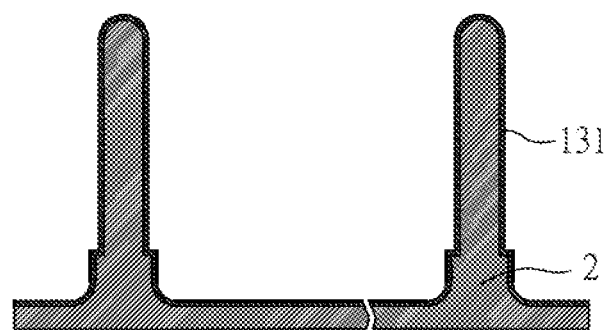

As shown in FIG. 2C, the step S02 is to provide a second plate 12, which has an opening end E1 (herein, the first opening end E1). In this embodiment, the second plate 12 is substantially a concave shape and is configured with the first opening end E1, which can be fabricated by metal or alloy. In order to assemble the first plate 11 and the second plate 12 in the following steps, the size of inner side of the first opening end E1 is substantially the same as the size of outer side of the plate body 111. Accordingly, the first plate 11 and the second plate 12 can be tightly connected.

Figure 2E:
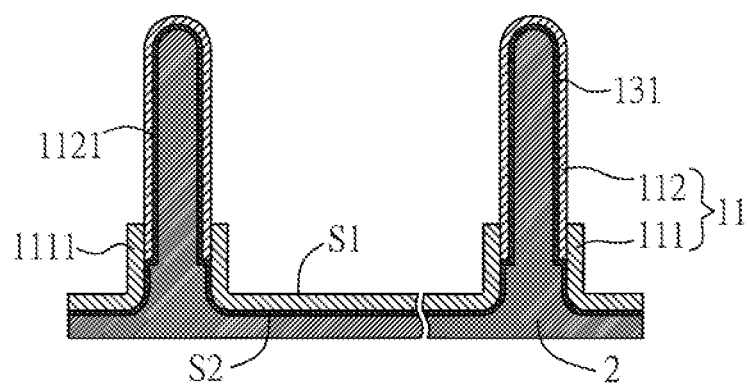
Figure 2F:
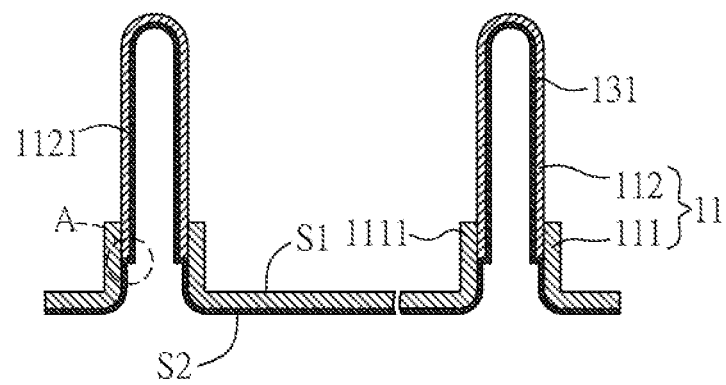

The step S03 is to dispose a first wick structure 131 on an internal wall 1121 of the heat conducting element 112 and the bottom surface S2 of the plate body 111. In order to disposed the first wick structure 131 on the first plate 11, the manufacturing method of this embodiment further includes steps of: providing a mold 2. The shape of the mold 2 is corresponding to the shape of the first plate 11 (see FIG. 2B). Herein, the shape of the mold 2 is corresponding to the internal wall 1121 of the heat conducting element 112 and the bottom surface S2 of the plate body 111 when the heat conducting element 112 is connected to the plate body 111. Then, the first wick structure 131 is disposed on the surface of the mold 2. In more detailed, the first wick structure 131 is disposed on the outer surface of the mold 2 (this disposing step is not needed for the inner surface of the mold 2). Afterwards, as shown in FIG. 2E, the mold 2 with the first wick structure 131 are inserted into the heat conducting element 112 of the first plate 11 and laid on the bottom surface S2 of the plate body 111. Accordingly, the first wick structure 131 can be disposed on the internal wall 1121 of the heat conducting element 112 and the bottom surface S2 of the plate body 111 through the mold 2. Next, as shown in FIG. 2F, the mold 2 is removed to leave the first wick structure 131 on the internal wall 1121 of the heat conducting element 112 and the bottom surface S2 of the plate body 111. Since the first wick structure 131 is disposed on the internal wall 1121 of the heat conducting element 112 and the bottom surface S2 of the plate body 111 through the mold 2, the first wick structure 131 is a continuous structure at the joints of the heat conducting elements 112 and the plate body 111 (the region A of FIG. 2F). Thus, the undesired thermal resistance of the conventional art does not exist in this disclosure.

Figure 2G:
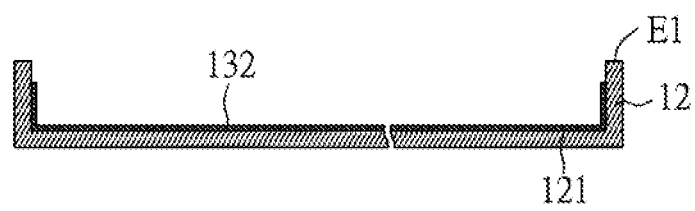
Figure 2H:
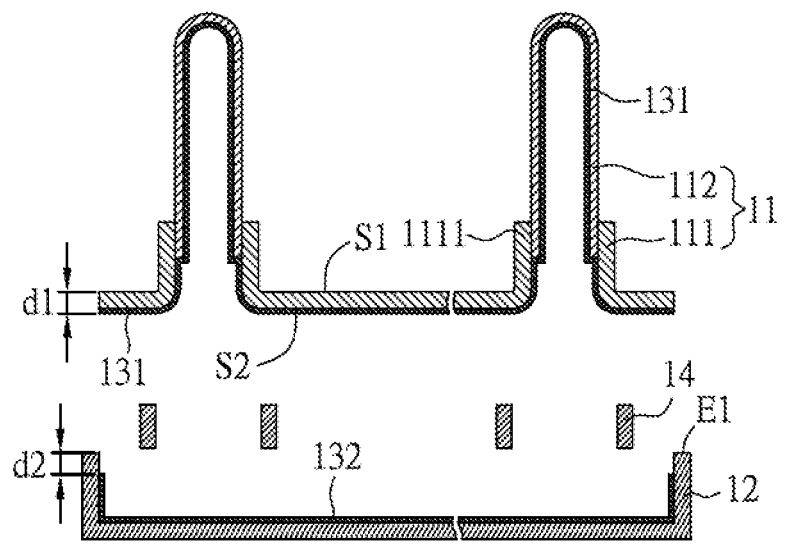
Figure 2I:
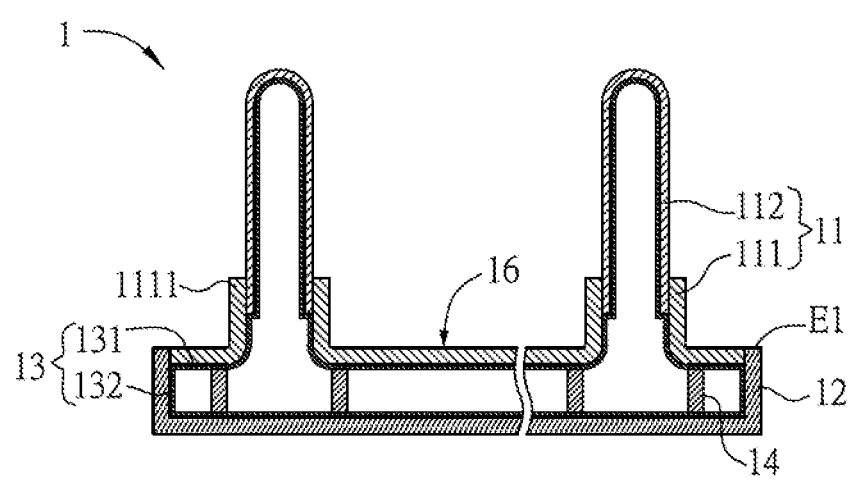

As shown in FIG. 2G the step S04 is to dispose a second wick structure 132 on an internal wall 121 of the second plate 12. In this case, the second wick structure 132 is also a continuous structure. In order to make the wick structures in the heat conducting device 1 to be a continuous structure, as shown in FIG. 2H, the summing thickness d1 of the plate body 111 and the first wick structure 131 is substantially equal to the remained distance d2 between the first opening end E1 and the second wick structure 132. As shown in FIG. 2I, when connecting the first plate 11 and the second plate 12, the first wick structure 131 and the second wick structure 132 can be connected to form a continuous wick structure 13.

To be noted, the first wick structure 131 and the second wick structure 132 can have different structural designs such as the trench-type, mesh-type, fiber-type or sinter-type wick structure, and this disclosure is not limited. Preferably, the first wick structure 131 and the second wick structure 132 are both sinter-type wick structures. In practice, no matter the heat conducting element 112 is manufactured and positioned in any shape, direction or angle, the sinter-type wick structure can perfectly carry the condensed working fluid back.

In addition, since the plate body 11 is substantially a planar plate, it is possible to provide at least one supporting member 14 and dispose the supporting member 14 between the second wick structure 132 on the second plate 12 and the first wick structure 131 on the plate body 111 before the step S05 of connecting the first plate 11 and the second plate 12 (as shown in FIGS. 2H and 2I) for preventing the subsidence of the first plate 11. In this embodiment, four supporting members 14 are disposed between the first wick structure 131 and the second wick structure 132. In the following procedures, the supporting members 14 can be removed or not.

Finally, the step S05 is to connecting the plate body 111 to the inner side of the first opening end E1 so as to connect the first plate 11 and the second plate 12 to form a chamber 16. Since the size of inner side of the first opening end E1 is substantially the same as the size of outer side of the plate body 111, they can be tightly connected. In this embodiment, the first plate 11 and the second plate 12 can be connected by welding or sintering (e.g. the open fire sintering, laser sintering, infrared sintering, or the sintering by other heating methods). This disclosure is not limited.

As shown in FIG. 2I, in the heat conducting device 1, the first plate 11 and the second plate 12 are connected to form the chamber 16 (vapor chamber), and then a working fluid (not shown) is filled into the chamber 16. The working fluid can be a coolant such as Freon, ammonia, acetone, methanol, ethanol, heptane, water, or the likes. The working fluid is selected based on the type of the heat source, and the selected working fluid must be vaporized to gaseous state by heat of the heat source and condensed to liquid state later. To be noted, selecting a coolant as the working fluid is just only an example. Besides, before filling the working fluid into the chamber 16 of the heat conducting device 1, it is necessary to vacuum the chamber 16 so as to prevent the impure gas (e.g. air) doped in the working fluid inside the chamber 16. The impure gas does not join the vaporization-condensation cycle, so it is named as a non-condensing gas, which can raise the vaporization temperature. Besides, the non-condensing gas occupies a part of the space of the chamber 16, and the heat conducting efficiency of the heat conducting device 1 will be affected. Of course, if the working fluid is water, the step for vacuuming the chamber 16 is not necessary.

As mentioned above, the manufacturing method of the heat conducting device 1 of the disclosure can form a continuous wick structure 13 on the inner walls between the heat conducting element 112 and the vapor chamber (chamber 16) without the undesired thermal resistance. Accordingly, the gaseous state working fluid can be rapidly transferred from the vapor chamber to each of the heat conducting elements 112 without the obstruction of additional thermal resistance. Besides, the liquid state working fluid, which is condensed by the heat conducting element 112, can flow back to the vapor chamber (chamber 16) through the wick structure 13 without undesired obstruction. Therefore, the heat conducting device 1 fabricated by the manufacturing method of the disclosure can have a higher heat conducting efficiency.

Figure 3:
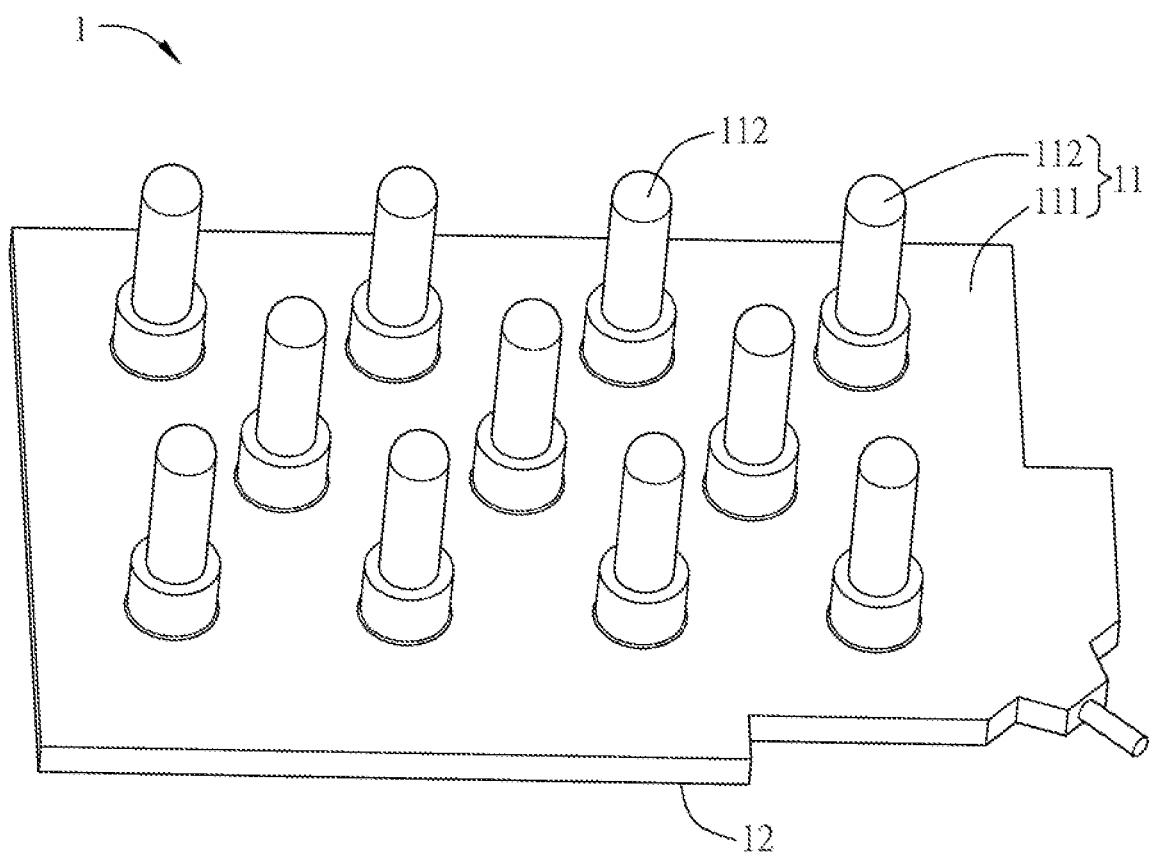
FIG. 3 is a schematic perspective diagram showing the heat conducting device of FIG. 2I of an embodiment.
Figure 4:
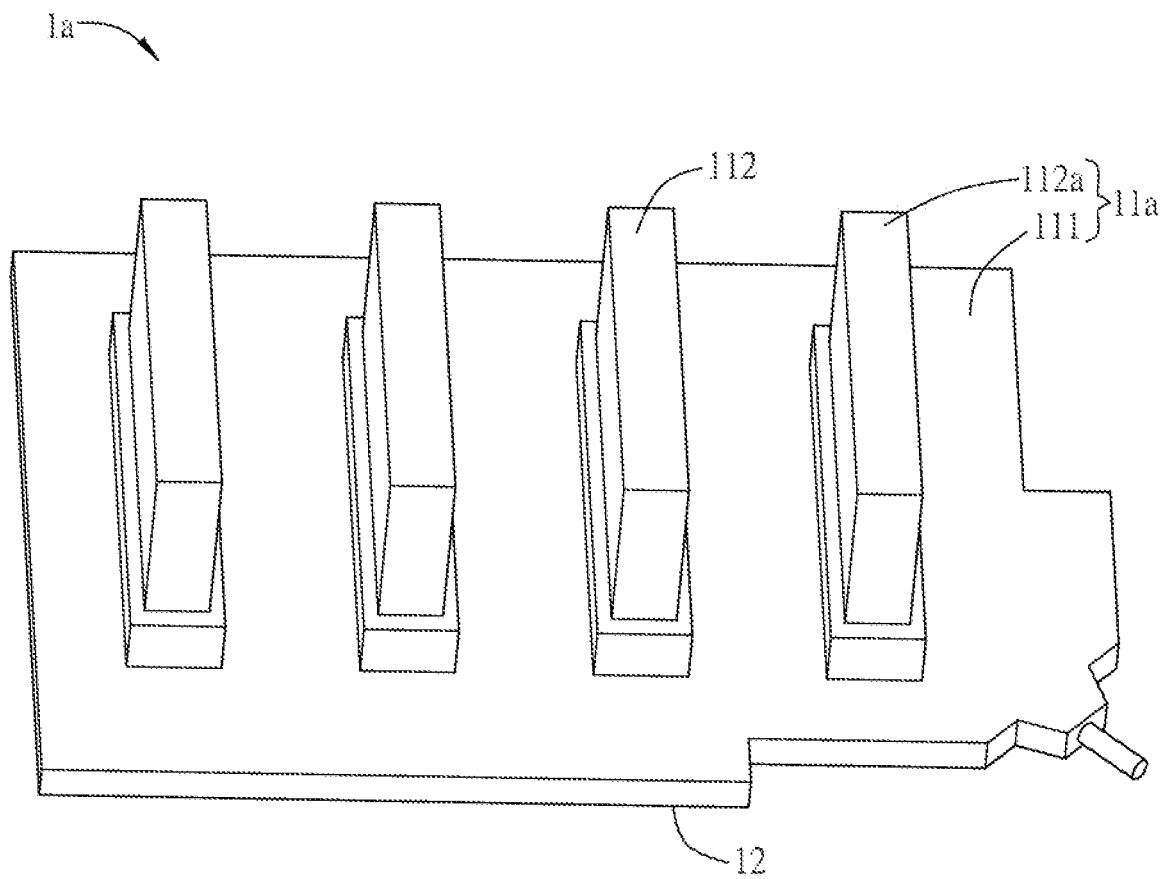
FIG. 4 is a schematic perspective diagram showing the heat conducting device of FIG. 2I of another embodiment.
Figure 5:
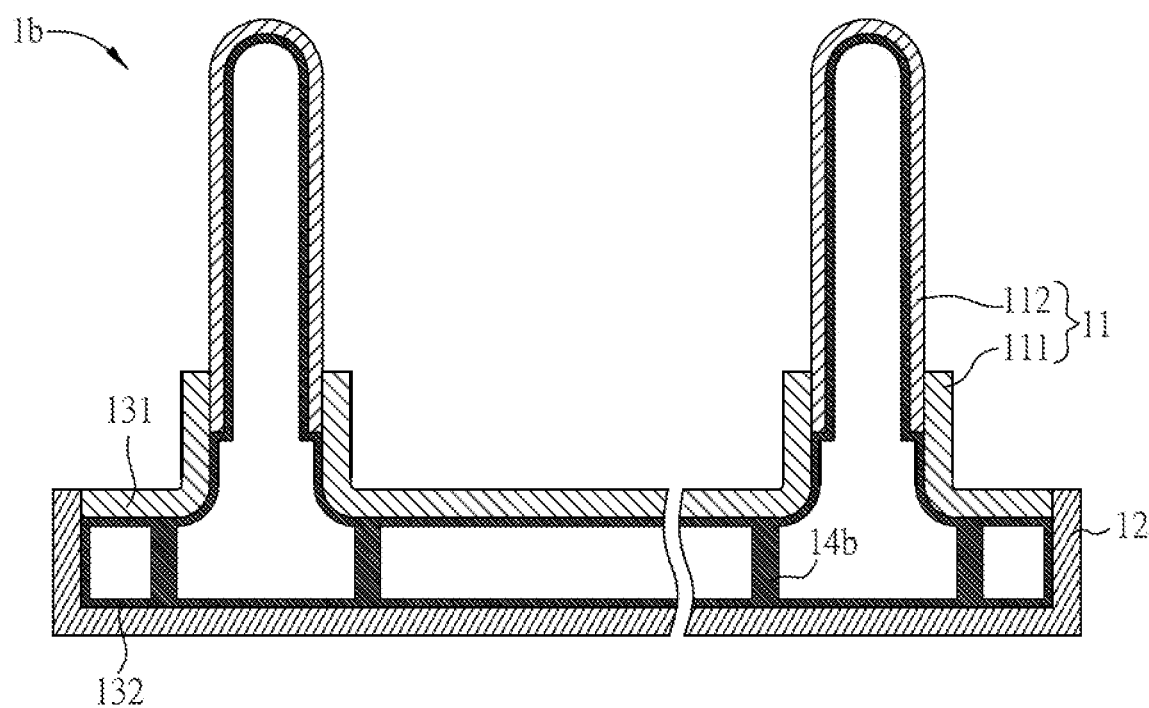
FIGS. 5 to 7 are sectional views of the heat conducting devices of different aspects of the disclosure, respectively.
Figure 6:
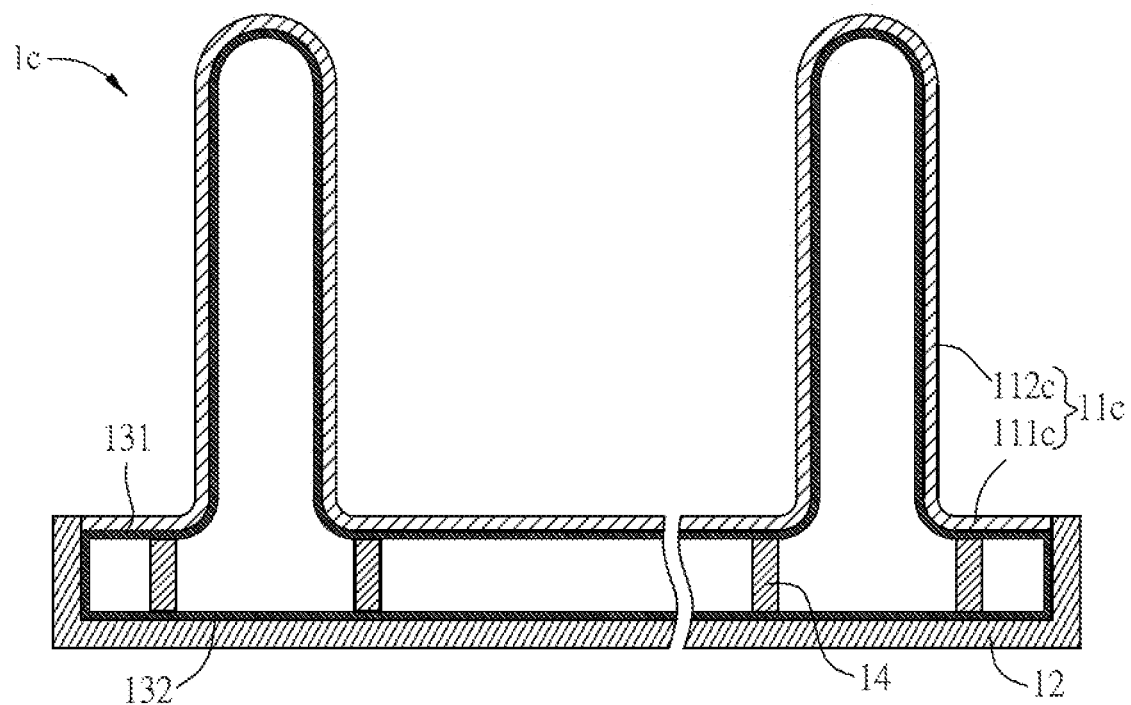

FIG. 3 is a schematic perspective diagram showing the heat conducting device 1 of FIG. 2I. FIG. 4 is a schematic perspective diagram showing another heat conducting device 1a of FIG. 2I. FIGS. 5 and 6 are sectional views of the heat conducting devices 1b and 1c of different aspects of the disclosure, respectively.

As shown in FIG. 3, the heat conducting element 112 of the heat conducting device 1 is a cylinder or cone-shaped heat pipe. In another embodiment, as shown in FIG. 4, the heat conducting element 112a of the heat conducting device 1a is a plate-type or bulk-type temperature plate (vapor chamber). The vapor chamber has a vacuum chamber surrounded by at least two welded metal plates (top and bottom metal plates), and it can rapidly transfer a local heat source to a large-area plate. The vapor chamber is a high heat-dissipating performance design so that can be applied to the heat-dissipating element with more critical conditions and provide a higher heat-dissipating efficiency.

Different from the heat conducting device 1 of FIG. 2I, the supporting members 14b of the heat conducting device 1b as shown in FIG. 5 have a structure the same as that of the first wick structure 131 or the second wick structure 132. In other words, the supporting members 14b can also be wick structures. Accordingly, the supporting members 14b can support the structure while also provide additional heat transferring paths for the working fluid so as to increase the entire working performance.

As shown in FIG. 6, it is an example that the first plate 11c of the heat conducting device 1c is integrally formed as one piece. In other words, the plate body 111c and the heat conducting element 112c are fabricated by bending and processing a single work piece.

The other technical features and manufacturing steps of the heat conducting devices 1a~1c can be referred to the manufacturing processes of the heat conducting device 1 as shown in FIGS. 1 and 2A to 2I, so the detailed descriptions thereof will be omitted.

Figure 7:
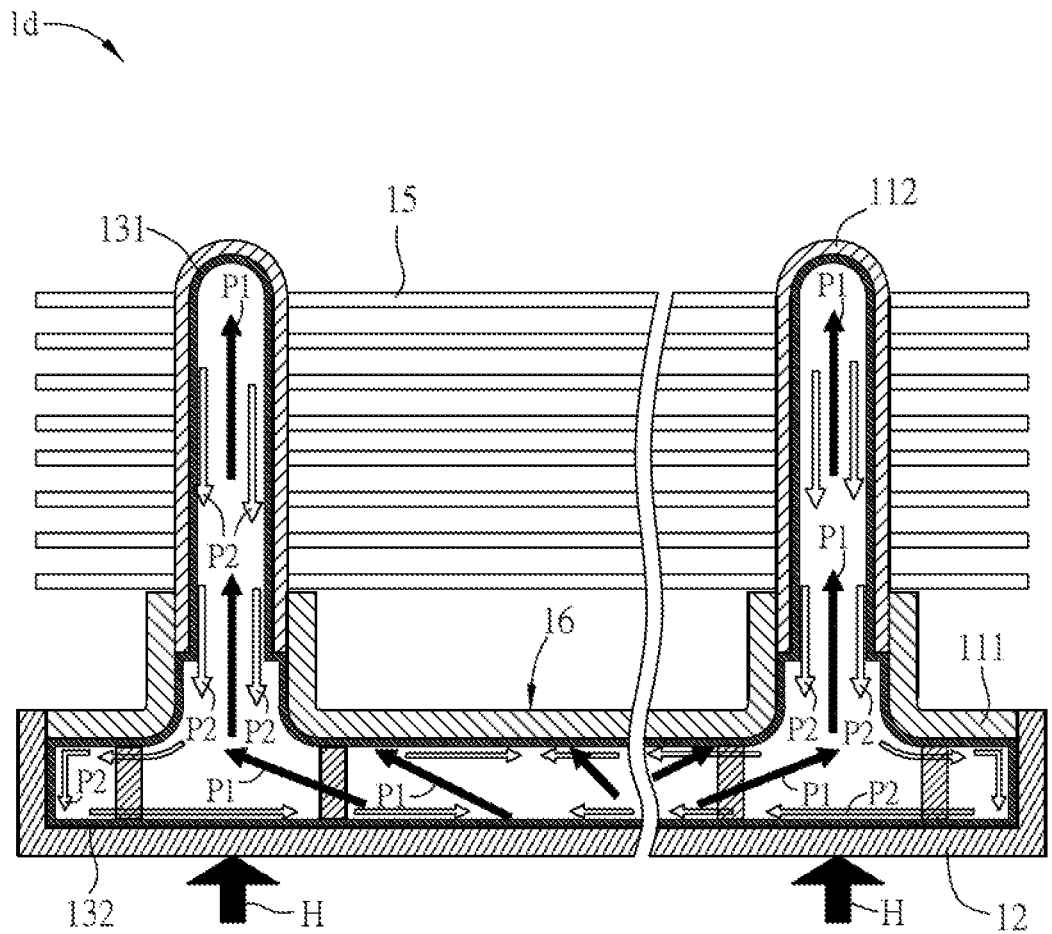

In order to increase the heat-dissipating efficiency, the heat conducting elements of the above embodiments can be further equipped with heat dissipating fins for increasing the heat dissipating efficiency of the heat conducting devices. For example, the heat conducting device 1 of FIG. 2I is installed with fins and as shown in FIG. 7. Of course, the heat conducting devices 1a~1c can also be equipped with the fins, and this disclosure is not limited.

Referring to FIG. 7, the manufacturing method of the heat conducting device 1d further includes the following steps of:

providing a plurality of fins 15; and assembling the fins 15 to the heat conducting element 112. In this embodiment, the fins 15 are arranged in parallel and disposed on outer surfaces of the heat conducting elements 112. The fins 15 can be made of metal or alloy with high heat conducting coefficient and disposed on the heat conducting element 112 by sintering, welding, mounting or locking. The configuration of the fins 15 can rapidly transfer the heat from the heat conducting element 112 to the environment, thereby increasing the thermal transferring efficiency.

When the vapor chamber (the chamber 16) of the heat conducting device 1d is contacted with the heat source, the heat H can be transferred to the vapor chamber (the chamber 16), so that the temperature of the vapor chamber (the chamber 16) is increased. Then, the working fluid inside the vapor chamber (the chamber 16) is evaporated to gaseous state. The gaseous state working fluid flows upwardly to the heat conducting element 112. The arrows P1 represent the flowing direction of the evaporated working fluid. After arriving to the heat conducting element 112, the working fluid can transfer and dissipate the carried heat H to the environment through the heat conducting element 112. Of course, the heat H can be further dissipated through the fins 15 (a path which arrows P1 represent). Then, the gaseous state working fluid can be condensed to liquid state working fluid after the heat H is dissipated, which will flow from the first wick structure 131 disposed on the internal wall 1121 of the heat conducting element 112 back to the second wick structure 132 inside the vapor chamber (the chamber 16). The arrows P2 represent the flowing direction of the condensed liquid state working fluid. Accordingly, the working fluid can cyclically flow in the heat conducting device 1d.

In summary, the manufacturing method of the disclosure can form a continuous wick structure on the inner walls between the heat conducting element and the vapor chamber without undesired thermal resistance. Accordingly, the gaseous state working fluid can be rapidly transferred from the vapor chamber to each of the heat conducting elements without the obstruction of additional thermal resistance. Besides, the liquid state working fluid, which is condensed by the heat conducting element, can flow back to the vapor chamber through the continuous wick structure without undesired obstruction. By the way, heat dissipating fins can further be equipped with the heat conducting element so as to enhance heat dissipating efficiency. Therefore, the heat conducting device fabricated by the manufacturing method of the disclosure can have a higher heat conducting efficiency.

Although the present disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the present disclosure.

What is claimed is:

1. A manufacturing method of a heat conducting device, comprising steps of:
providing a first plate, wherein the first plate comprises a plate body and at least a heat conducting element, the plate body has at least an inserting end disposed corresponding to the heat conducting element and defining a tube, and the heat conducting element is mounted at the tube;
providing a second plate, wherein the second plate has a first opening end;
providing a mold, wherein a shape of the mold corresponds to a shape of the first plate;
disposing a first wick structure on a surface of the mold;
inserting the mold with the first wick structure to the heat conducting element of the first plate;
disposing the first wick structure on an internal wall of the heat conducting element and a bottom surface of the plate body through the mold; and
removing the mold;
disposing a second wick structure on an internal wall of the second plate; and
connecting the plate body to the first opening end so as to connect the first plate and the second plate to form a chamber.

2. The manufacturing method of claim 1, wherein the heat conducting element is a heat pipe or a temperature plate.

3. The manufacturing method of claim 1, wherein the first plate is integrally formed as one piece.

4. The manufacturing method of claim 1, wherein the heat conducting element has a second opening end, and the manufacturing method further comprises a step of:
inserting the second opening end of the heat conducting element into an inner side of the tube.

5. The manufacturing method of claim 1, wherein the heat conducting element has a second opening end, and the manufacturing method further comprises a step of:
inserting the second opening end of the heat conducting element on an outer side of the tube.

6. The manufacturing method of claim 1, wherein a size of an inner side of the first opening end is substantially the same as a size of the plate body.

7. The manufacturing method of claim 1, wherein thicknesses of the plate body and the first wick structure are substantially the same as a distance between the first opening end and the second wick structure.

8. The manufacturing method of claim 1, wherein the first wick structure is connected to the second wick structure.

9. The manufacturing method of claim 1, wherein before the step of connecting the first plate and the second plate to form the chamber, the manufacturing method further comprises steps of:
providing at least a supporting member; and
disposing the supporting member between the second wick structure of the second plate and the first wick structure of the plate body.

10. The manufacturing method of claim 9, wherein the supporting member has a structure the same as the first wick structure or the second wick structure.

11. The manufacturing method of claim 1, wherein the heat conducting element is connected to the plate body by sintering or welding.

12. The manufacturing method of claim 1, wherein the first plate and the second plate are connected by sintering or welding.

13. The manufacturing method of claim 1, further comprising steps of:
providing a plurality of fins; and
assembling the fins to the heat conducting element.

14. The manufacturing method of claim 1, further comprising steps of:
vacuuming the chamber; and
filling a working fluid in the chamber.

\* \* \* \* \*